United States Patent [19]
Maida

[11] 3,930,253
[45] Dec. 30, 1975

[54] CIRCUIT FOR CONVERTING AN ANALOG INPUT SIGNAL VOLTAGE INTO A DIGITAL REPRESENTATION

[75] Inventor: Osamu Maida, Tokyo, Japan
[73] Assignee: Nippon Kogaku K.K., Tokyo, Japan

[22] Filed: Jan. 24, 1974
[21] Appl. No.: 436,170

[30] Foreign Application Priority Data
Feb. 1, 1973 Japan .............................. 48-12452

[52] U.S. Cl. .............................. 340/347 AD
[51] Int. Cl.$^2$ .............................. H03K 13/175
[58] Field of Search .............................. 340/347 AD

[56] References Cited
UNITED STATES PATENTS

| | | | |
|---|---|---|---|
| 3,187,325 | 6/1965 | Waldhauer | 340/347 AD |
| 3,599,202 | 8/1971 | De Vey | 340/347 AD |
| 3,603,799 | 9/1971 | Nobusawa | 250/214 R |
| 3,735,390 | 5/1973 | Drangeid et al. | 340/347 AD |

*Primary Examiner*—Malcolm A. Morrison
*Assistant Examiner*—Vincent J. Sunderdick
*Attorney, Agent, or Firm*—Fitzpatrick, Cella, Harper & Scinto

[57] ABSTRACT

A circuit which can convert an analog input signal voltage into a digital representation. The invention provides a plurality of voltage detecting circuit stages which are arranged so that they are not simultaneously brought in conductive to maintain the input impedance at a desired level. Luminous diodes are well arranged to be lighted properly.

7 Claims, 4 Drawing Figures

CIRCUIT FOR CONVERTING AN ANALOG INPUT SIGNAL VOLTAGE INTO A DIGITAL REPRESENTATION

BACKGROUND OF THE INVENTION

1. Field of the Invention

The present invention relates to a circuit for converting an analog input signal voltage into a digital representation.

2. Description of the Prior Art

Presently known circuits for converting a value of the analog input signal voltage into a digital representation are as shown in FIGS. 1 and 2 representing block diagrams.

First, in FIG. 1 there is shown a circuit in which Schmidt circuits (= Schmidt trigger circuits) SC1, SC2, SC3, SC4, ....., each different in trigger voltage, are successively arranged across the input signal voltage $V_{in}$ to drive a representation circuit by way of the inversion signals from the Schmidt circuits.

Secondly, in FIG. 2 there is shown a circuit in which a plurality of potential detecting circuit stages are successively arranged to drive a representation circuit, each stage of the voltage detecting circuit having a different reference potential, that is to say, $$\frac{RB}{RA+RB} < \frac{RD}{RC+RD} < \frac{RF}{RE+RD} < \frac{RH}{RG+RH} <$$

and constructed in such a manner that the emitter of the transistor is connected with a divided point between resistors (RA – RH) which divide the source voltage E, the input signal voltage $V_{in}$ is applied to the base, the divided voltage determined by way of the resistors is made a reference potential for comparison and the output of said transistors is applied to the representation circuit.

In these conventional circuits, when the input signal voltage is raised, numerous detecting circuit stages are brought into conductive condition in parallel and therefore it is difficult to raise the input impedance, thus causing unstabilized operation of the circuit. Particularly, in the circuit shown in FIG. 1 employing the Schmidt circuits, it has such a disadvantage that due to its hysteresis property, the indication obtained when the input signal voltage rises is different from the indication obtained when said voltage drops.

SUMMARY OF THE INVENTION

The present invention has for its object to overcome the limitations noted above with respect to prior art circuits by providing a circuit for converting an analog input signal voltage into a digital representation, which is an improvement in the circuit shown in FIG. 2 not employing Schmidt circuits.

The invention will be best understood upon perusal of the following detailed description of a specific embodiment with reference to the accompanying drawing.

DESCRIPTION OF THE PREFERRED EMBODIMENTS

Figure 3:
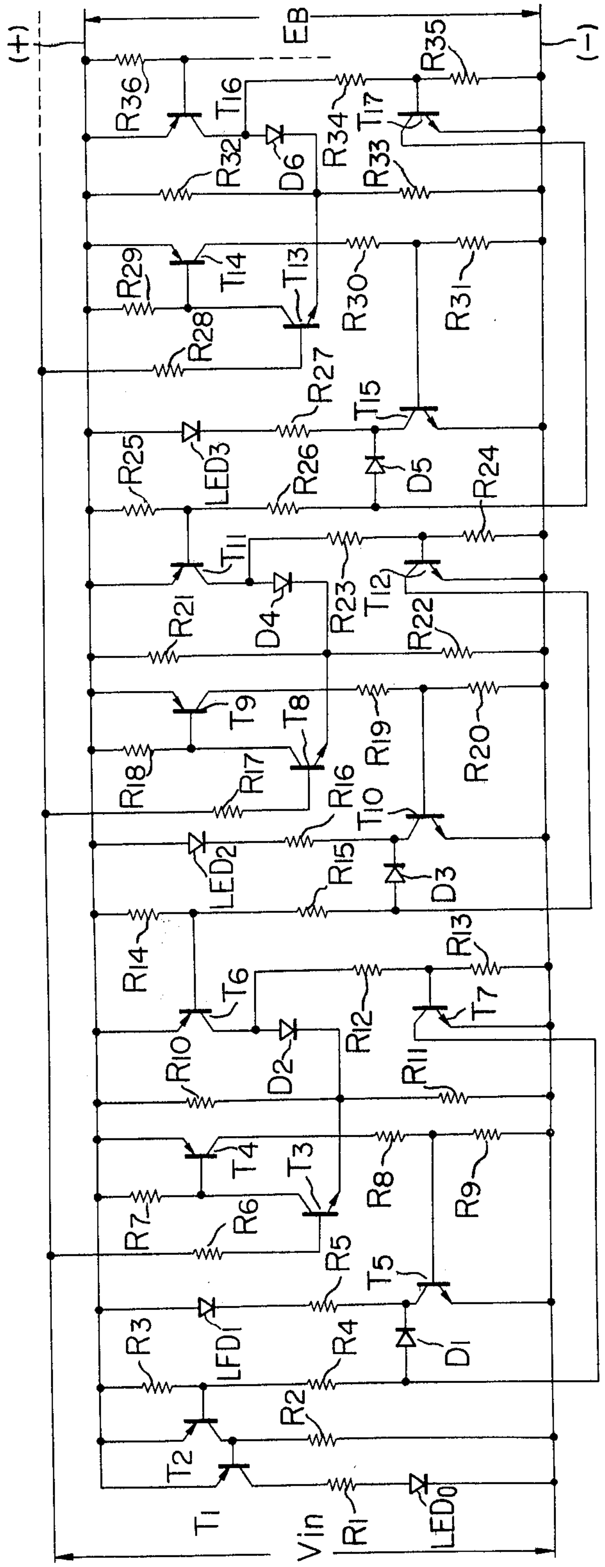
FIG. 3 is a circuit diagram illustrating an embodiment in accordance with the present invention.

Turning now to FIG. 3 illustrating a circuit diagram, there is shown a source voltage EB, and a transistor T1 for switching a luminous diode $LED_0$. Transistor T2 having its collector and emitter connected with the base and emitter of the transistor T1 has its function opposite to that of the transistor T1. Transistor T3 is a first voltage detecting transistor, the emitter of which is connected with a divided point between resistors R10 and R11 which divide the source voltage EB, and the base of which is connected with an input line through a resistor R6. Transistor T5 is provided for switching the luminous diode $LED_1$ by way of the on-and-off operation of the first voltage detecting transistor T3 and the transistor T4 which provides amplification. Transistor T6 is a first counter-bias transistor, the emitter of which is connected with a positive (+) line of the source, and the collector of which is connected with an anode of a reverse current blocking diode D2, the cathode of the diode D2 being connected with a divided point between resistors R10 and R11. The first counter-bias transistor T6 is designed so that when this transistor T6 is turned on, a reference potential determined by the resistors R10 and R11 is fixed to a voltage obtained by subtracting a voltage drop portion of the diode D2 from the source voltage EB to place the transistor T3 in a counter bias condition. Transistor T7 is a first counter-bias detecting transistor, the base of which is connected with the collector of the first counter-bias transistor T6, and the collector of which is connected with the base of the transistor T2 through the resistor R4. The first counter bias detecting transistor T7 has its collector connected with the collector of the transistor T5 for switching the luminous diode $LED_1$ through the reverse current blocking diode D1. When the counter-bias transistor T6 is turned on, the transistor T7 becomes turned on, and when the transistor T6 is turned off, the transistor T7 becomes turned off because current flowing from the divided point between the resistors R10 and R11 to the base of the transistor T7 is blocked by the reverse current blocking diode D2.

A first voltage detecting circuit stage is formed by the circuit elements as described above.

Transistor T10 is a transistor for switching a luminous diode $LED_2$ by way of the on-and-off operation of a second voltage detecting transistor T8 and a transistor T9 which provides amplification. The second voltage detecting transistor T8 has its emitter connected with a divided point between resistors R21 and R22 which divide the source voltage EB, and has its base connected with an input line through a resistor R17. Transistor T11 is a second counter-bias transistor, the emitter of which is connected with a positive line of the source and the collector of which is connected with an anode of a reverse current blocking diode D4. The cathode of the diode D4 is connected with the divided point between the resistors R21 and R22. The second counter-bias transistor T11 is designed so that when the transistor T11 is turned on, a reference potential determined by the resistors R21 and R22 is fixed to a voltage obtained by subtracting a voltage drop portion of the diode D4 from the source voltage EB to place the transistor T8 in a counter bias condition. Transistor T12 is a second counter-bias detecting transistor, the base of which is connected with a collector of the counter-bias transistor T11, and the collector of which is connected with the base of the first counter-bias transistor T6. When the second counter-bias transistor T11 is turned on, the second counter-bias detecting transistor T12 becomes turned on, and when the transistor T11 is turned off, the transistor T12 becomes turned off because current flowing from the divided point between the resistors R21 and R22 to the base of the transistor T12 is blocked by the reverse current blocking diode D4. A second voltage detecting circuit stage is formed by the circuit elements as described above. Due to the fact that the second voltage detecting stage is set in the detecting voltage higher than that of the first voltage detecting circuit stage, a value of resistance is selected so as to fulfill the relationship of $$\frac{R11}{R10 + R11} < \frac{R22}{R21 + R22}$$

A third voltage detecting circuit stage is similarly formed, which is provided with transistors T14 and T15 for switching a luminous diode $LED_3$ by way of an output of the third voltage detecting transistor T13, a counter-bias transistor T16, a reverse current blocking diode D6, a counter-bias detecting transistor T17, etc.

Thus, the final n stage of voltage detecting circuit is formed. This *n* stage of the voltage detecting circuit is not provided with a counter-bias transistor and a counter-bias detecting transistor. Further, due to the fact that the detecting voltage of the third voltage detecting circuit stage is set higher than the detecting voltage of the second voltage detecting circuit stage, a value of resistance is selected so as to fulfill the relationship of $$\frac{R22}{R21 + R22} < \frac{R33}{R32 + R33}$$

The detecting voltage is set higher in the order of the fourth, the fifth, ...... the *n* stage, and therefore the value of resistance is selected as described above.

In FIG. 3, reference character $R_i$, where $i = 1,2,3,....36$, designates resistors.

With this arrangement, the conversion circuit operates as follows.

Presume that $V_{in}$ is an input signal voltage in the voltage detecting circuit, V1 is an input signal voltage when the first voltage detecting circuit stage is turned on (i.e., V1 is a value of voltage in which the voltage in the input line rises in excess of the threshold voltage capable of turning on the transistor T3 relative to the reference potential determined by the resistors R10 and R11 which divide the source voltage EB so as to turn on the transistor T3, V2 (V1 < V2) is an input signal voltage when the second voltage detecting circuit is turned on, and the rest being similarly presumed such as V3, V4, ....... V*n* (V2 < V3 < V4 ...... < Vn).

First, if the input signal voltage $V_{in}$ is $V_{in}$ < V1, the first, the second, ...... the *n* voltage detecting circuit stages are all placed in off condition because the input signal voltage $V_{in}$ is not greater than the detecting voltage. That is to say, when the *n* voltage detecting circuit stage is in off, condition the transistor switching the luminous diode LEDn is off and therefore the ($n - 1$) counter-bias transistor is off. Accordingly, the ($n - 1$) counter-bias detecting transistor is also off. Further, when the ($n - 1$) voltage detecting circuit stage is off, the transistor switching the luminous diode $LED_{n-1}$ is off and the ($n - 1$) counter-bias detecting transistor is also off, and therefore the ($n - 2$) counter-bias transistor is off. Accordingly, the ($n - 2$) counter-bias detecting transistor is also off. Similarly, the ($n - 3$), ..... the second, the first counter-bias transistors, and the counter-bias detecting transistor become turned off, and therefore the transistor T2 becomes turned off. Therefore, the transistor T1 becomes turned on as it is forward-biased by way of the resistor R2, and the luminous diode $LED_o$ luminesces. Since other luminous diodes are not lighted, the input signal voltage $V_{in}$ is indicated $V_{in}$ < V1 when the luminous diode $LED_o$ is lighted.

Next, if the voltage $V_{in}$ is V1 < $V_{in}$ < V2, the first voltage detecting circuit stage becomes turned on, while the second, third, ..... the *n* voltage detecting circuit stages are off as they are not greater than the detecting voltage. That is to say, although the ($n - 1$), ...... the second, the first counter-bias transistors and the counter bias detecting transistors are in off similarly to those described above, the first voltage detecting transistor T3 becomes turned on and the transistor T5 is placed in on condition by being amplified by the transistor T4, and the luminous diode $LED_1$ goes on. On the other hand, the transistor T2 becomes turned on as it is forward-biased through the resistor R4 and the reverse current blocking diode D1, and at the same time the transistor T1 becomes turned off and the luminous diode $LED_o$ goes off. Accordingly, only the luminous diode $LED_1$ goes on and the input signal voltage $V_{in}$ is indicated V1 < $V_{in}$ < V2.

Next, if the voltage $V_{in}$ is V2 < $V_{in}$ < V3, as in the foregoing, the ($n - 1$), ..... the third, and the second counter-bias transistors and the counter-bias detecting transistors become turned off. However, the second voltage detecting transistor T8 is turned on and amplified by the transistor T9, so that the transistor T10 switching the luminous diode $LED_2$ is placed in on condition so that current is passed into the luminous diode $LED_2$, which then goes on. Further, as the transistor T10 is in on the first counter-bias transistor T6 is forward-biased through the resistor R15 and the reverse current blocking diode D3 and becomes turned on. Thus the emitter potential of the first voltage detecting transistor T3 is held in voltage obtained by subtracting the forward voltage drop portion of the reverse current blocking diode D2 from the source voltage EB, so that the transistor T3 is placed in a counter-bias condition and can not be turned on, and thus current is not passed into the luminous diode $LED_1$. On the other hand, the first counter-bias transistor T6 is on, and therefore the first counter-bias detecting transistor T7 and the transistor T2 become turned on so that the transistor T1 becomes turned off, whereby the luminous diode $LED_o$ will not go on. Namely, the input signal voltage $V_{in}$ is the voltage capable of turning on the first and the second voltage detecting circuit stages but causes only the luminous diode $LED_2$ in the second voltage detecting circuit stage to be lighted, so that the voltage $V_{in}$ may be indicated V2 < $V_{in}$ < V3.

Next, if the voltage $V_{in}$ is V3 < $V_{in}$ < V4, the ($n - 1$), .... the third counter-bias transistors and the counter-bias detecting transistor become turned on as in the foregoing. However, when the third voltage detecting transistor T13 is turned on and amplified by the transistor T14, the transistor T15 is placed in on condition so that the luminous diode $LED_3$ goes on. Further, as the transistor T15 is in on condition, the second counter-bias transistor T11 is forward-biased through the resistor R26 and the reverse current blocking diode D5 and becomes turned on and the emitter potential of the second voltage detecting transistor T8 is held in voltage obtained by subtracting the forward voltage drop portion of the reverse current blocking diode D4 from the source voltage EB, and consequently transistor T8 is placed in a counter-bias condition and can not be turned on, and thus the luminous diode $LED_2$ will not go on.

On the other hand, the second counter-bias transistor T11 is on, and therefore the second counter-bias detecting transistor T12 becomes turned on and thus the first counter-bias transistor T6 becomes turned on as it is forward-biased through the resistor R15, whereby the emitter potential of the first voltage detecting transistor T3 is held in voltage obtained by subtracting the forward voltage drop portion of the reverse current blocking diode D2 from the source voltage EB, and the transistor T3 is placed in a counter-bias condition and can not be turned on. Consequently, the luminous diode $LED_1$ will not go on. Further, the first counter-bias transistor T6 is on, and therefore the transistor T7 becomes turned on and thus the transistor T2 also becomes turned on. As a result, transistor T1 becomes turned off so that the luminous diode $LED_0$ will not go on.

Therefore, the input signal voltage $V_{in}$ is the voltage capable of turning on the first, the second, and the third voltage detecting circuit stages but causes only the luminous diode $LED_3$ in the third voltage detecting circuit stage to be lighted. With this, the voltage $V_{in}$ may be indicated $V3 < V_{in} < V4$.

Similarly, even if the input signal voltage $V_{in}$ is varied such as $V4 < V_{in} < V5$, ......, $V_{n-1} < V_{in} < V_n$, $V_n < V_{in}$, the voltage $V_{in}$ enables only the voltage detecting circuit stage having a highest detecting voltage among the detectable voltage detecting circuit stages to be turned on, and the voltage detecting circuit stage lower by one stage in the detecting voltage than the voltage detecting circuit stage which is on, is placed in a counter-bias condition by way of the output of the voltage detecting circuit stage which is on. Further, this counter-bias condition causes the voltage detecting circuit stages further lower in the detecting voltage to successively place in a counter-bias condition through the counter-bias detecting circuit to thereby place all the voltage detecting circuit stages having a detecting voltage lower than that of the voltage detecting circuit stage which is on, in a counter-bias condition and to light only the indicating luminous diode corresponding to the voltage detecting circuit stage, which is on, thus indicating the value of the input signal voltage $V_{in}$.

Figure 1:
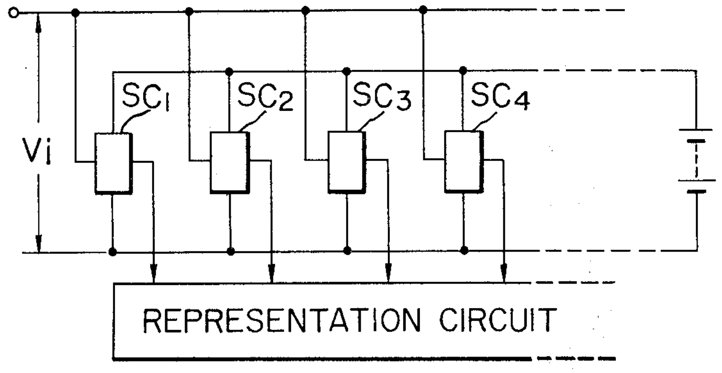
FIG. 1 PRIOR ART
FIGS. 1 and 2 are block diagrams illustrating conventional circuits for converting an analog input signal voltage into a digital representation.
Figure 2:
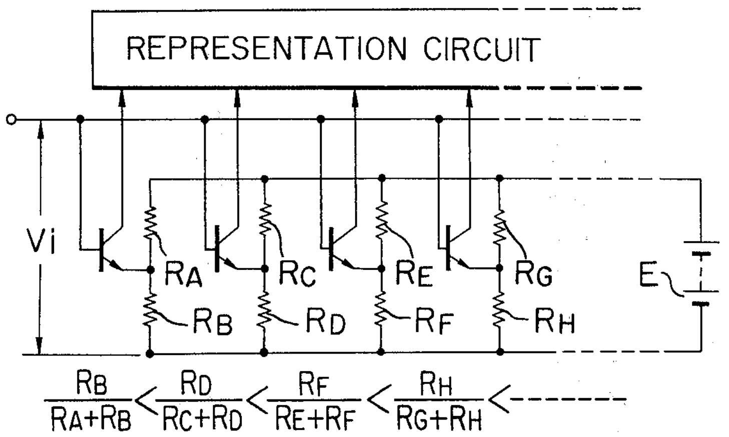
FIG. 2 PRIOR ART
Figure 4:
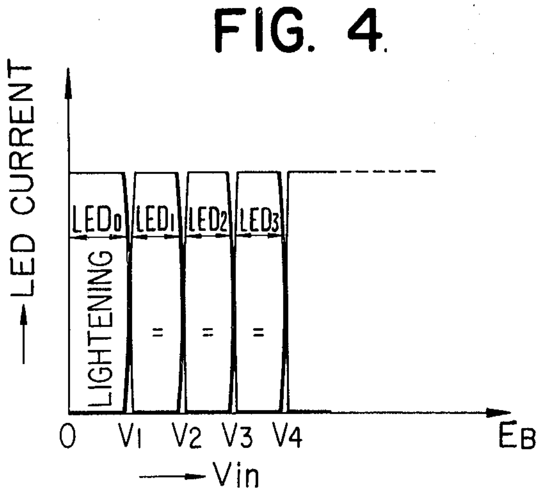
FIG. 4 illustrates wave forms obtained from the circuit shown in FIG. 3.

As for example, variation in current of the luminous diode $LED_2$, that is, the switching characteristic, relative to variation in the input signal voltage $V_{in}$ by way of the second voltage detecting transistor T3 and transistors T9 and T10 has the slope characteristic as shown in FIG. 4 as an amplifier is not applied with positive feedback by these transistors. In FIG. 4, the axis of abscissa indicates the input signal voltage $V_{in}$ and the axis of ordinate indicates current passed into the luminous diode. Therefore, the switching characteristic, in which the first voltage detecting transistor T3 is placed in a counter-bias condition by way of the transistor T6 to turn off the luminous diode $LED_1$, has also the slope characteristic. That is, there is a very narrow region as both diodes $LED_0$ and $LED_1$ light when the input signal voltage $V_{in}$ varies to replace with the luminous diode indicating the voltage V1. Therefore, when two luminous diodes are lighted, it indicates the switching voltage.

In accordance with the present invention as described above, a plurality of the voltage detecting circuit stages are not simultaneously brought into conductive condition so that the input impedance is never lowered. Therefore, the input signal voltage may accurately be indicated. Further, one luminous diode usually goes on and two diodes go on when switched to thereby facilitate reading and to require less power consumption. Furthermore, since the Schmidt circuits are not employed, it is natural that indications of the input signal voltage at the time of its rise and fall are quite reversibly obtained to produce no hysteresis characteristic.

I claim:

1. A circuit for converting an analog input signal from an analog signal source to a digital representation comprising a plurality of electrically sequential switching means ($T_3$, $R_{10}$, $R_{11}$, $T_4$, $T_5$; $T_8$, $R_{21}$, $R_{22}$, $T_9$, $T_{10}$; $T_{13}$, $R_{32}$, $R_{33}$, $T_{14}$, $T_{15}$) which have different detecting voltages, each of said switching means generating a detecting signal when an analog input signal voltage from said analog signal source equals a detecting voltage, a plurality of electrically sequential operating means ($T_6$, $D_2$; $T_{11}$, $D_4$; $T_{16}$, $D_6$; $T_7$, $T_{12}$, $T_{17}$) for preventing an analog input current from said analog source from flowing into said plurality of switching means, each of said plurality of operating means being actuated upon application of a detecting signal from the sequentially preceding switching means and the thus actuated operating means actuating the following sequentially operating means.

2. Circuit according to claim 1, further comprising a plurality of indicating means, which are energized respectively by the sequential switching means.

3. Circuit according to claim 1, wherein each of said plurality of operating means includes a first control means ($T_6$, $D_2$; $T_{11}$, $D_4$; $T_{16}$, $D_6$), a second control means ($T_7$, $T_{12}$, $T_{17}$) which is connected to said first control means, generating a control signal and applying the control signal to the following operating means, said first control means being actuated upon application of either the detecting signal from the preceding switching means or the control signal from the preceding second control means and said first control means making inoperative the switching means corresponding thereto.

4. Circuit according to claim 3, wherein each of said plurality of switching means includes a voltage generating circuit ($R_{10}$, $R_{11}$; $R_{21}$, $R_{22}$; $R_{32}$, $R_{33}$) for generating a predetermined reference voltage and a circuit for comparing the analog input signal voltage to the predetermined reference voltage, the comparing circuit generating a detecting signal when said analog input signal voltage and said reference voltage achieve a predetermined relationship.

5. Circuit according to claim 4, wherein said comparing circuit includes a voltage detecting transistor to the base of which the analog input signal voltage is applied and to the emitter of which said predetermined reference voltage is applied, said voltage detecting transistor being conductive when the analog input signal reaches said reference voltage.

6. Circuit according to claim 5, wherein said first control means includes counter-bias transistor means ($T_6$, $T_{11}$, $T_{16}$) which makes non-conductive the voltage detecting transistor of the comparing circuit electrically following the first control means.

7. Circuit according to claim 6, wherein said second control means includes counter-bias detecting transistor means ($T_7$, $T_{12}$, $T_{17}$) which detects energization of said counter-bias transistor means and actuates the counter-bias transistor means in the first control circuit electrically following said second control means.

* * * * *